(12) United States Patent
Kim et al.

(10) Patent No.: US 12,048,182 B2
(45) Date of Patent: Jul. 23, 2024

(54) ADHESIVE COMPOSITION AND DISPLAY DEVICE COMPRISING THE SAME

(71) Applicant: LG Display Co., Ltd., Seoul (KR)

(72) Inventors: Byonghoo Kim, Paju-si (KR); DaeHeung Lee, Paju-si (KR); JuHyuk Kim, Goyang-si (KR); Youngsub Shin, Goyang-si (KR); Aram Sohn, Seongnam-si (KR); Sungjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 182 days.

(21) Appl. No.: 17/550,641

(22) Filed: Dec. 14, 2021

(65) Prior Publication Data

US 2022/0199941 A1 Jun. 23, 2022

(30) Foreign Application Priority Data

Dec. 21, 2020 (KR) .......................... 10-2020-0179895

(51) Int. Cl.
*H01L 51/52* (2006.01)
*H01L 51/56* (2006.01)
*H10K 50/842* (2023.01)
*H10K 71/00* (2023.01)

(52) U.S. Cl.
CPC ......... *H10K 50/8426* (2023.02); *H10K 71/00* (2023.02)

(58) Field of Classification Search
CPC .......... H10K 50/8426; H10K 59/8722; H10K 59/873; H10K 50/844; H01L 25/0753; H01L 33/56
See application file for complete search history.

(56) References Cited

U.S. PATENT DOCUMENTS

| 2017/0051188 A1* | 2/2017 | Fujii | ........................ C09J 9/00 |
| 2019/0119532 A1 | 4/2019 | Takeko et al. | |
| 2020/0135971 A1* | 4/2020 | Beak | .................... H10K 59/122 |
| 2021/0367020 A1* | 11/2021 | Bok | .................... H10K 59/126 |

FOREIGN PATENT DOCUMENTS

KR 10-2019-0004290 A 1/2019

* cited by examiner

*Primary Examiner* — Tracie Y Green
(74) *Attorney, Agent, or Firm* — Seed IP Law Group LLP

(57) ABSTRACT

Provided is a display device. The display device includes a substrate including a plurality of pixels, an adhesive layer on the substrate, a light emitting diode on the adhesive layer, a planarization layer surrounding the light emitting diode, a connection electrode on the planarization layer, and a transparent protective layer on the connection electrode. At least one layer of the adhesive layer, the planarization layer, and the transparent protective layer includes a plurality of multi-shell structured particles. The multi-shell structured particles are included in the display device so that the adhesion and the adhesion holding power between the light emitting diode and the driving panel are improved to increase the product yield and improve the luminance of the light emitting diode, thereby providing a display device with low power consumption.

20 Claims, 4 Drawing Sheets

ADHESIVE COMPOSITION AND DISPLAY DEVICE COMPRISING THE SAME

CROSS-REFERENCE TO RELATED APPLICATIONS

This application claims the priority of Korean Patent Application No. 10-2020-0179895 filed on Dec. 21, 2020, in the Korean Intellectual Property Office, the entire disclosure of which is incorporated herein by reference.

BACKGROUND

Technical Field

The present disclosure relates to an adhesive composition and a display device including the same, and more particularly, to a display device using a light emitting diode (LED) with an improved yield and an improved optical extraction efficiency.

Description of the Related Art

As it enters an information era, a display field which visually expresses electrical information signals has been rapidly developed, and in response to this, various display devices having excellent performances such as thin-thickness, light weight, and low power consumption have been developed. Specific examples of such display devices include liquid crystal display (LCD) devices, plasma display panel (PDP) devices, field emission display (FED) devices, organic light emitting display (OLED) devices, and the like.

As a representative display device, a liquid crystal display device does not use a self-emitting method so that a backlight unit is disposed below the liquid crystal display device, which increases the thickness of the liquid crystal display device. Further, the backlight unit limits implementation of the display device with various designs and a luminance and a response speed may be degraded.

In contrast, a display device which includes a self-emitting element may be implemented to be thinner than a display device with an embedded light source, and thus allows implementation of a flexible and foldable display device.

As one of the display devices including a self-emitting element, an organic light emitting display device uses an organic light emitting diode as a pixel so that a separate light source is not necessary. However, in the organic light emitting display device, a dark spot may be easily generated due to moisture or oxygen permeation so that various technical structures to block the permeation of the oxygen and the moisture are additionally required.

In recent years, a light emitting display device which uses a micro light emitting diode (LED) having a minute size as the light emitting diode has been studied and developed. Such light emitting display device having high image quality and high reliability has been spotlighted as the next generation display device.

However, with the current technology, it is difficult to fix the ultra-small micro LED to a large size substrate and it takes a much longer time to fix the micro LED. The current technology thus is not suitable for applying the micro LED to the large size display device. Specifically, when the micro LED is transferred onto the existing planarization layer or insulating layer, the adhesion between the micro LED and the planarization layer is caused by the residual solvent in the planarization layer. However, when the planarization layer is hardened, the amount of the residual solvent is reduced so that the surface adhesion is lost, which results in the film tearing. Further, the adhesion holding time is shortened so that the product yield is lowered.

Accordingly, in order to implement a display device with a micro LED as a light emitting diode, a transferring technique which moves the micro LED to a driving panel needs to be developed.

BRIEF SUMMARY

An adhesive composition according to the present disclosure is usable to improve adhesion holding property and optical extracting property of a display device.

A display device according to the present disclosure includes a transfer-type planarization layer with excellent adhesion property to increase the transfer rate of a light emitting diode.

According to the present disclosure, it is possible to simplify the manufacturing process for fabricating layers which configure the display device by a single transferring process.

The benefits and advantages of the present disclosure are not limited to the above non-limiting examples, and other benefits and advantages, which are not mentioned above, can be clearly understood by those skilled in the art from the following description.

According to an aspect of the present disclosure, a display device includes: a substrate including a plurality of pixels; an adhesive layer disposed on the substrate; a light emitting diode disposed on the adhesive layer; a planarization layer disposed on the substrate so as to enclose the light emitting diode; a connection electrode disposed on the planarization layer; and a transparent protective layer disposed on the connection electrode. At least one layer selected from the group consisting of the adhesive layer, the planarization layer, and the transparent protective layer includes a plurality of multi-shell structured particles. The multi-shell structured particles included in the display device are usable to improve adhesion and the adhesion holding power between the light emitting diode and the driving panel, and thus increases the product yield and improves the luminance of the light emitting diode, so that a display device with low power consumption may be obtained.

According to another aspect of the present disclosure, an adhesive composition includes: a plurality of multi-shell structured particles each including a center portion including a tackifier material; a first outer portion including a molecular sieve which encloses the center portion; and a second outer portion including fullerene which encloses the first outer portion; a photosensitive material; and a binder. The adhesive composition exhibits excellent adhesion and adhesion holding property. The adhesive composition also exhibits good optical extraction property due to the presence of mesoporous molecular sieve.

According to still another aspect of the present disclosure, a method for forming a display device includes: forming an adhesive layer on a substrate; attaching a light emitting diode to the adhesive layer; depositing a first planarization layer on the adhesive layer to surround the light emitting diode; depositing a second planarization layer on the first planarization and the light emitting diode; forming a connection electrode on the second planarization layer; and depositing a transparent protective layer on the connection electrode. At least one layer of the adhesive layer, the first planarization layer, the second and the transparent protective layer includes a plurality of multi-shell structured particles.

Each of the plurality of multi-shell structured particles includes: a center portion including a tackifier material; a first outer portion enclosing the center portion, the first outer portion including a molecular sieve; and a second outer portion enclosing the first outer portion, the second outer portion including fullerene.

Other detailed matters of the embodiments of the disclosure are included in the detailed description with reference to the enclosed drawings.

According to the present disclosure, an adhesive composition with the improved adhesion holding power and the improved optical extraction efficiency includes a plurality of multi-shell structured particles formed by a tackifier material, a molecular sieve, and fullerene.

According to the present disclosure, a display device includes a plurality of multi-shell structured particles in at least one of an adhesive layer, a planarization layer, and a transparent protective layer to improve a transfer rate of the light emitting diode and product yield.

According to the present disclosure, linearity and scattering of the light generated from the light emitting diode are enhanced by the multi-shell structured particle so that the display device with a low power consumption and a high luminance may be provided.

According to the present disclosure, a photosensitive material and a binder are included so that an adhesive layer, a planarization layer, and a transparent protective layer are manufactured by one transferring process. Therefore, the display device may be manufactured by a simplified manufacturing process.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
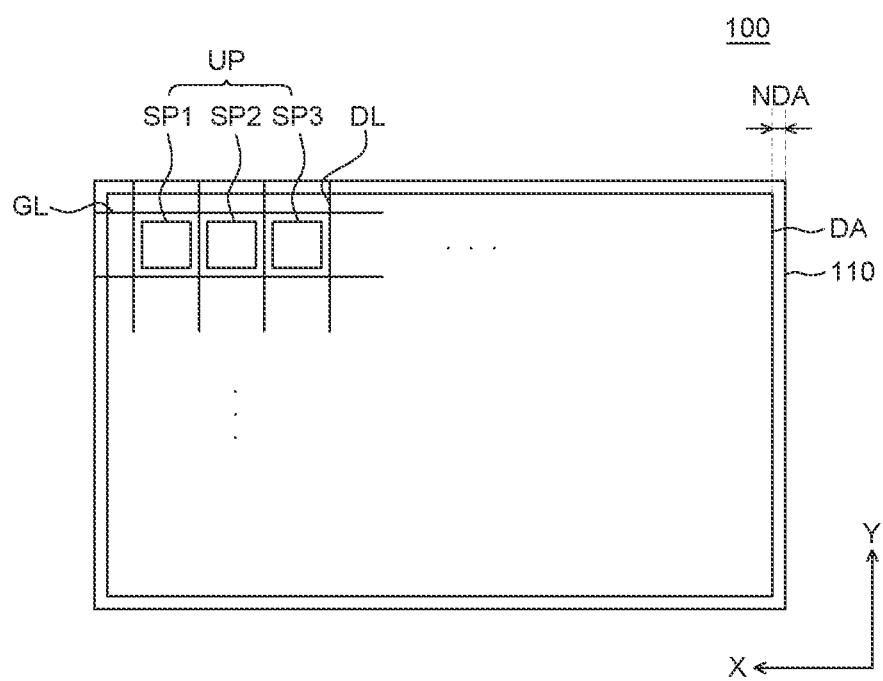
FIG. 1 is a plan view of a display device according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device and an adhesive composition according to embodiments of the present disclosure will be described in detail with reference to accompanying drawings.

Figure 2:
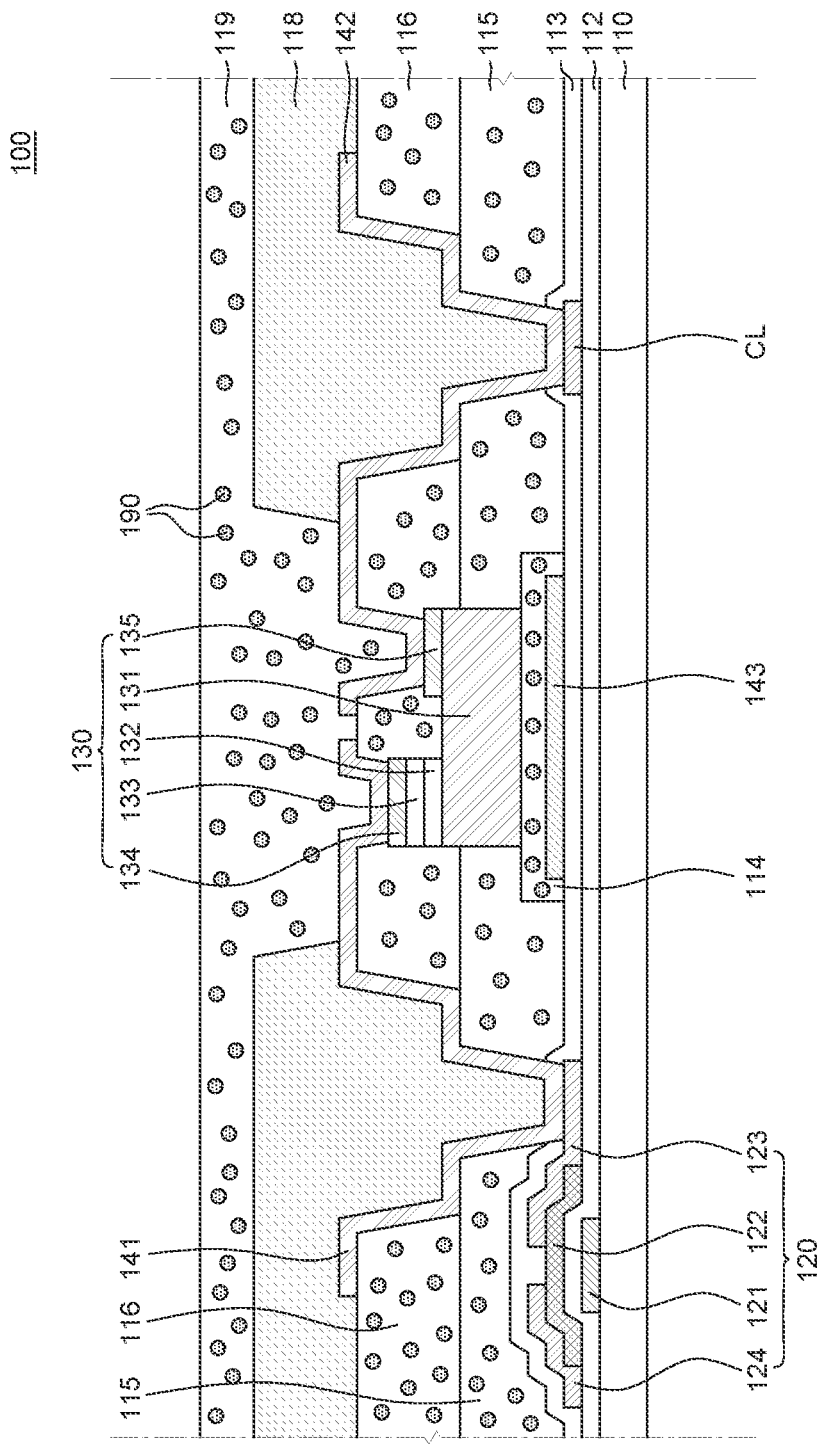
FIG. 2 is a cross-sectional view of the display device of FIG. 1 according to an embodiment of the present disclosure.

FIGS. 1 and 2 are views of a display device 100 according to an embodiment of the present disclosure.

FIG. 1 is a plan view of a display device 100 according to an embodiment of the present disclosure.

Referring to FIG. 1, in the display device 100 according to the embodiments of the present disclosure, a display area DA in which images are displayed and a non-display area NDA which surrounds the display area DA may be defined. In the display area DA, a light emitting diode (for example, a micro light emitting diode) and a driving element (for example, a thin film transistor) for driving the light emitting diode may be disposed. The non-display area NDA is an area in which the image is not displayed and various wiring lines and a control circuit which are connected to the elements disposed in the display area DA may be disposed.

Although it is illustrated that the display device 100 is defined by the display area DA and the non-display area DNA, the present disclosure is not limited thereto and the display device 100 may be defined such that the non-display area NDA may not be provided.

In the display area DA, a plurality of unit pixels UP is provided. Each of the plurality of unit pixels UP may include a plurality of sub pixels SP1, SP2, SP3, but is not limited thereto. In each of the plurality of sub pixels SP1, SP2, SP3, a thin film transistor and a light emitting diode may be provided as a driving element and a light emitting diode, respectively. The light emitting diode and the thin film transistor may be connected to a driver such as a gate control circuit and a data control circuit by means of a wiring line such as a gate line GL and a data line DL. When the size of the light emitting diode is 100 µm or smaller, the display device may be called a micro LED display device. When the size of the light emitting diode is several hundreds of micrometers, the display device may be called a mini LED display device.

FIG. 2 is a cross-sectional view of the display device 100 according to an embodiment of the present disclosure.

The display device 100 according to the embodiments of the present disclosure includes a substrate 110, an adhesive layer 114, a reflective layer 143, a thin film transistor 120, a light emitting diode 130, a first planarization layer 115, a second planarization layer 116, a first connection electrode 141, a second connection electrode 142, and a common line CL.

The substrate 110 is a base member which supports various elements of the display device and may be formed of an insulating material. For example, the substrate 110 may be a glass substrate or a plastic substrate. For example, the plastic substrate may be selected from polyimide, polyethersulfone, polyethylene terephthalate, and polycarbonate, but is not limited thereto. When a flexible plastic substrate is used to implement a flexible property and a foldable property, a support member such as a back plate may be disposed below the substrate 110. The flexible plastic substrate is thinner and has a weaker rigidity than the glass substrate so that when various elements are disposed, the plastic substrate may be sagged. The back plate supports the substrate 110 formed of a plastic material to prevent the sagging of the substrate 110 and protects the display panel from moisture, heat, and impacts. For example, the back plate may be a metal material such as stainless steel (SUS) or a plastic material such as polymethylmethacrylate, polycarbonate, polyvinyl alcohol, acrylonitryl-butadiene-styrene, or polyethylene terephthalate.

Although in FIG. 2 it is illustrated that the thickness of the substrate 110 is small, the thickness of the substrate 110 may be much larger than a total thickness of a layered structure provided on the substrate 110. The substrate may be configured by a plurality of layers or a substrate in which a plurality of substrates is bonded.

The thin film transistor 120 is formed on the substrate 110. The thin film transistor 120 includes a gate electrode 121, a semiconductor layer 122, a source electrode 123, and a drain electrode 124.

The gate electrode 121 is disposed on the substrate 110 together with the gate line GL. The gate electrode 121 is covered by a gate insulating layer 112. The gate insulating layer 112 may be configured by a single layer or a plurality of layers formed of an inorganic material and may be formed of silicon oxide (SiOx), silicon nitride (SiNx), or the like. The gate line GL may be formed on the same layer as the gate electrode 121. The gate line GL may be formed of the same material as the gate electrode 121. The data line DL may also be formed having the same purpose as the gate line GL.

The semiconductor layer 122 is provided with a predetermined pattern (or as an island) shape on the gate insulating layer 112 so as to overlap the gate electrode 121. The semiconductor layer 122 may be configured by a semiconductor material formed of one or more of amorphous silicon, polycrystalline silicon, oxide, and organic materials, but is not limited thereto.

The source electrode 123 is disposed so as to overlap one side of the semiconductor layer 122. The source electrode 123 is disposed together with the data line DL and a driving power line.

The drain electrode 124 is disposed to be spaced apart from the source electrode 123 while overlapping the other side of the semiconductor layer 122. The drain electrode 124 is disposed together with the source electrode 123 to be divided or protrude from an adjacent driving power line.

An interlayer insulating layer 113 is disposed on the source electrode 123 and the drain electrode 124 to protect the thin film transistor 120. In the interlayer insulating layer 113, a hole which exposes a part of the source electrode 123 of the thin film transistor 120 may be formed. However, the interlayer insulating layer 113 may be omitted in some embodiments.

The common line CL is disposed on the gate insulating layer 112. The common line CL is a wiring line for applying a common voltage to the light emitting diode 130 and may be disposed to be spaced apart from the gate line GL or the data line DL. Further, the common line CL may extend in the same direction as the gate line GL or in the same direction as the data line DL. The common line CL may be formed of the same material as the source electrode 123 and the drain electrode 124, but is not limited thereto. In some embodiments, the common line CL may be formed of the same material as the gate electrode 121. The interlayer insulating layer 113 is formed on the common line CL, and a hole which exposes a part of the common line CL may be formed in the interlayer insulating layer 113.

The reflective layer 143 is disposed on the interlayer insulating layer 113. The reflective layer 143 may be disposed in a position that corresponds to emission areas of the plurality of sub pixels SP1, SP2, SP3. The reflective layer 143 is a layer configured to reflect a portion of emitted light which is directed to the substrate 110, among light emitted from the light emitting diode 130, onto an upper portion of the display device 100 to output the light to the outside of the display device 100. The reflective layer 143 may be formed of a metal material having a high reflectivity.

The adhesive layer 114 is disposed on the reflective layer 143. The adhesive layer 114 is a layer for bonding the light emitting diode 130 onto the reflective layer 143 and also for insulating the reflective layer 143 formed of a metal material from the light emitting diode 130. The adhesive layer 114 may be formed of a thermal curable material or a photo curable material, but is not limited thereto. The adhesive layer 114 may be disposed so as to overlap the reflective layer 143 disposed in each sub pixel. As shown in FIG. 2, the adhesive layer 114 may be separated for the plurality of sub pixels SP1, SP2, SP3 so as to overlap the reflective layer 143, but is not limited thereto. The adhesive layer 114 may be disposed on the entire interlayer insulating layer 113.

In the meantime, in the display device 100 according to the embodiments of the present disclosure, the adhesive layer 114 may be formed from an adhesive composition including a plurality of multi-shell structured particles 190 according to the embodiments of the present disclosure. That is, the adhesive layer 114 may include a plurality of multi-shell structured particles 190 and further include a photosensitive material and a binder. The multi-shell structured particle 190, the photosensitive material, and the binder will be described in detail below.

The light emitting diode 130 is disposed on the adhesive layer 114 to overlap the reflective layer 143. The light emitting diode 130 includes an n-type layer 131, an active layer 132, a p-type layer 133, an n-electrode 135, and a p-electrode 134. Hereinafter, although it is described that a lateral structured light emitting diode 130 is used as the light emitting diode 130, the structure of the light emitting diode 130 is not limited thereto, and a vertical or flip structure is also available. The light emitting diode 130 may have a micro size (i.e., a chip size may be 100 μm or smaller) or a mini size (i.e., a chip size may be several hundreds of micro meters (μm)).

A laminating structure of the light emitting diode 130 according to an embodiment of the present disclosure is as follows: The n-type layer 131 may be formed by injecting an n-type impurity into gallium nitride (GaN). The active layer 132 is disposed on the n-type layer 131. The active layer 132 is a light emitting layer which emits light in the light emitting diode 130 and may be formed of a nitride semiconductor, for example, indium gallium nitride (InGaN). The p-type layer 133 is disposed on the active layer 132. The p-type layer 133 may be formed by injecting a p-type impurity into gallium nitride. However, constituent materials of the n-type layer 131, the active layer 132, and the p-type layer 133 are not limited thereto.

As described above, the light emitting diode 130 may be manufactured by sequentially laminating the n-type layer 131, the active layer 132, and the p-type layer 133, and then etching a predetermined part to form the n-electrode 135 and the p-electrode 134. In this case, the predetermined part which is a space for separating the n-electrode 135 and the p-electrode 134 from each other may be etched to expose a part of the n-type layer 131. In other words, surfaces of the light emitting diode 130 on which the n-electrode 135 and the p-electrode 134 will be disposed are not on the same height level, but have different height levels.

As described above, the n-electrode 135 may be disposed on the exposed n-type layer 131. The n-electrode 135 may be formed of a conductive material and for example, formed of a transparent conductive oxide. In the meantime, in an area which is not etched, that is, on the p-type layer 133, the p-electrode 134 may be disposed. The p-electrode 134 may also be formed of a conductive material and for example, formed of a transparent conductive oxide. Further, the p-electrode 134 may be formed of the same material as the n-electrode 135.

As described above, in a state in which the n-type layer 131, the active layer 132, the p-type layer 133, the n-electrode 135, and the p-electrode 134 are formed, the light emitting diode 130 may be disposed such that the n-type layer 131 is adjacent to the reflective layer 143 more than the n-electrode 135 and the p-electrode 134.

The first planarization layer 115 and the second planarization layer 116 are formed on the interlayer insulating layer 113 to cover the light emitting diode 130. The first planarization layer 115 and the second planarization layer 116 are formed on the interlayer insulating layer 113 with a thickness enough to cover the entire interlayer insulating layer 113 including a portion where the light emitting diode 130 is disposed, and the remaining portion. In FIG. 2, although it is illustrated that two planarization layers 115 and 116 are used to manufacture the display device 100, the number of planarization layers is not limited thereto. In some embodiments, a single planarization layer may be used. Further, three or more planarization layers may also be used.

Referring to FIG. 2, the first planarization layer 115 of the display device 100 according to the embodiments of the present disclosure planarizes an upper portion of the thin film transistor 120. The first planarization layer 115 may planarize an upper portion of the thin film transistor 120 in a region where the light emitting diode 130 is disposed and a region excluding the contact structure. The second planarization layer 116 may be disposed on the first planarization layer 115. The second planarization layer 116 may be disposed above the thin film transistor 120 and the light emitting diode 130 in a region excluding the contact structure. At this time, the second planarization layer 116 may be formed to expose a partial area of each of the p-electrode 134 and the n-electrode 135 of the light emitting diode 130.

The first planarization layer 115 and the second planarization layer 116 are formed of an organic insulating material and may serve to fix the position of the light emitting diode 130. That is, the first planarization layer 115 and the second planarization layer 116 are disposed after disposing the light emitting diode 130 so that the first planarization layer 115 and the second planarization layer 116 are completely adhered to the light emitting diode 130. Unlike the conventional method in which a receiving space, such as a cup or a hole, is first formed in a planarization layer and then the light emitting diode is transferred into the cup or the hole, in the present disclosure by disposing the planarization layer after placing the light emitting diode 130, the light emitting diode 130 is more stably fixed to its position.

The first planarization layer 115 and the second planarization layer 116 may be formed at the same time or separately formed in two times. When a single planarization layer is formed, the process time may be excessively increased so that the planarization layers may be separately formed in two times. When the first planarization layer 115 and the second planarization layer 116 are separately formed in two times, contact structures formed in the planarization layers may also be formed at different timings.

In the meantime, in the display device 100 according to the embodiments of the present disclosure, at least one of the first planarization layer 115 and the second planarization layer 116 may be formed from an adhesive composition including a plurality of multi-shell structured particles 190 according to the embodiments of the present disclosure. That is, the first planarization layer 115 and/or the second planarization layer 116 may include a plurality of multi-shell structured particles 190 and further include a photosensitive material and a binder. The multi-shell structured particle 190, the photosensitive material, and the binder will be described in detail below.

The connection electrodes 141 and 142 are in contact with the p-electrode 135 and the n-electrode 134 of the light emitting diode 130, respectively and are referred to as the first connection electrode 141 and the second connection electrode 142.

The first connection electrode 141 connects the thin film transistor 120 and the p-electrode 134 of the light emitting diode 130. The first connection electrode 141 may be in contact with the source electrode 123 of the thin film transistor 120 by means of the contact structure formed in the first planarization layer 115, the second planarization layer 116, and the interlayer insulating layer 113. Further, the first connection electrode 141 may be in contact with the p-electrode 134 of the light emitting diode 130 by means of the contact structure formed in the second planarization layer 116. However, the present disclosure is not limited thereto so that depending on the type of the thin film transistor 120, the first connection electrode 141 may be defined to be in contact with the drain electrode 124 of the thin film transistor 120. The first connection electrode 141 may be defined as an anode electrode.

The second connection electrode 142 connects the common line CL and the n-electrode 135 of the light emitting diode 130. The second connection electrode 142 is in contact with the common line CL by means of the contact structure formed in the first planarization layer 115, the second planarization layer 116, the interlayer insulating layer 113, and the adhesive layer 114. Further, the second connection electrode 142 is in contact with the n-electrode 135 of the light emitting diode 130 by means of the contact structure formed in the second planarization layer 116. The second connection electrode 142 may be defined as a cathode electrode.

Therefore, when the display device 100 is turned on, different voltage levels which are applied to the source electrode 123 of the thin film transistor 120 and the common line CL are transmitted to the p-electrode 135 and the n-electrode 134 through the first connection electrode 141 and the second connection electrode 142, respectively. By doing this, the light emitting diode 130 emits light. In FIG. 2, it is illustrated that the thin film transistor 120 is electrically connected to the p-electrode 134 and the common line CL is electrically connected to the n-electrode 135, but the present disclosure is not limited thereto. In some embodiments, the thin film transistor 120 may be electrically connected to the n-electrode 135 and the common line CL may be electrically connected to the p-electrode 134.

The bank 118 is an insulating layer which defines an emission area and is formed on the second planarization layer 116. The bank 118 is formed of an organic insulating material and may be formed of the same material as the first planarization layer 115 and/or the second planarization layer 116. In some embodiments, in order to suppress the color mixture due to the transmission of light which is emitted from the light emitting diode 130 to adjacent sub pixels SP1, SP2, and SP3, the bank 118 may include a black material configured to absorb light. Here, the bank 118 may be selectively disposed as needed and may be omitted.

The transparent protective layer 119 covers the light emitting diode 130 and the planarization layers 115 and 116 to protect the light emitting diode 130. Further, as shown in FIG. 2, the transparent protective layer 119 may be disposed in an open area defined by the bank 118 and disposed above the second planarization layer 116 and an area which overlaps the bank 118. The transparent protective layer 119 may be an optical clear adhesive (OCA) or an optical clear resin (OCR), but is not limited thereto.

In some embodiments, in the display device 100 according to the embodiments of the present disclosure, the transparent protective layer 119 may be formed from an adhesive composition including a plurality of multi-shell structured particles 190. That is, the transparent protective layer 119 may include a plurality of multi-shell structured particles 190 and further include a photosensitive material and a binder. The multi-shell structured particle 190, the photosensitive material, and the binder will be described in detail below.

Figure 3A:
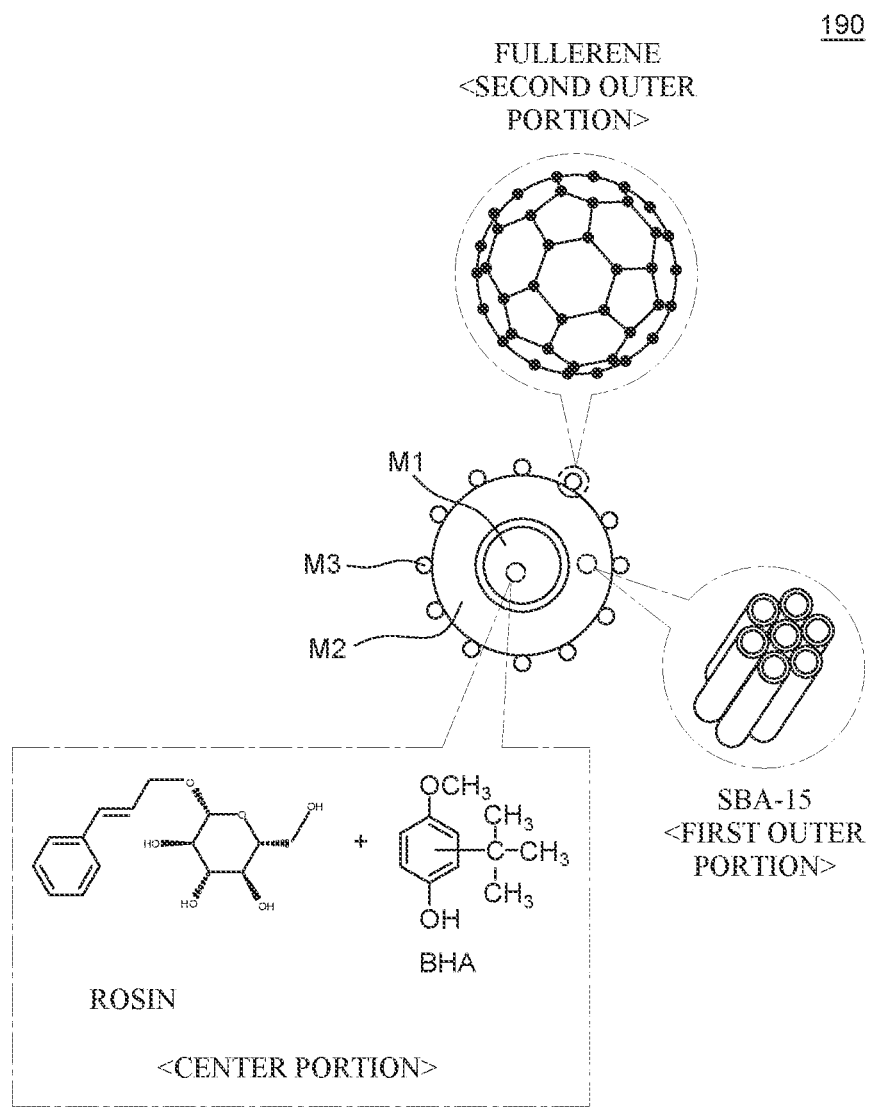
FIG. 3A is a cross-sectional view illustrating a multi-shell structured particle according to an embodiment of the present disclosure.

FIG. 3A is a cross-sectional view illustrating an example of a multi-shell structured particle 190 of the present disclosure.

At least one of the adhesive layer 114, the first planarization layer 115, the second planarization layer 116, and the transparent protective layer 119 described above in the display device 100 according to the embodiments of the present disclosure may include the multi-shell structured particles 190 and further include a photosensitive material and a binder. Although in FIG. 2, it is illustrated that the multi-shell structured particles 190 are included in all the adhesive layer 114, the first planarization layer 115, the second planarization layer 116, and the transparent protective layer 119, it is merely an example, so that the multi-shell structured particles 190 may be selectively disposed as needed. For example, the multi-shell structured particles 190 may be included only in the adhesive layer 114 or may be included in the adhesive layer 114, the first planarization layer 115, and the second planarization layer 116. The multi-shell structured particles 190 may supplement adhesive performance, optical extraction performance, photo performance, and film hardness of the adhesive layer 114, the first planarization layer 115, the second planarization layer 116, or the transparent protective layer 119.

Referring to FIG. 3A, the multi-shell structured particle 190 is formed of a center portion M1, a first outer portion M2 which encloses the center portion M1, and a second outer portion M3 which encloses the first outer portion M2.

The center portion M1 of the multi-shell structured particle 190 is a layer which gives an adhesive performance and is formed of a tackifier material. Specifically, the tackifier material includes a rosin-based resin or a terpene-based resin. Further, the tackifier material may include at least one derivative of a compound selected from the group consisting of phenol, phosphorus, and ether. For example, the center portion M1 may include rosin and butylated hydroxy anisole (BHA).

The first outer portion M2 is a layer configured to provide the hardness and the optical extraction performance and is formed of a molecular sieve. The molecular sieve may be a porous molecular sieve having a pore diameter of approximately 1.5 nm to 50 nm, and specifically, may be at least one selected from the group consisting SBA-1(Santa Barbara Amorphous-1), SBA-3(Santa Barbara Amorphous-3), SBA-6(Santa Barbara Amorphous-6), SBA-15(Santa Barbara Amorphous-15), MCM-41(Mobil Composition of Matter-41), and MCM-48(Mobil Composition of Matter-48), but is not limited thereto. For example, the first outer portion M2 may include SBA-15. The SBA is abbreviation of Santa Barbara Amorphous and highly stable mesoporous silica sieve developed by researchers at the University of California at Santa Barbara. The MCM is abbreviation of Mobil Composition of matter and is a mesoporous material with a hierarchical structure.

The second outer portion M3 is a layer serving to improve the hardness and the optical extraction characteristic together with the first outer portion M2 and may include fullerene. A diameter of the fullerene may be from 0.5 nm to 1 nm. When this range is satisfied, an appropriate size of the multi-shell structured particle 190 may be maintained without degrading the adhesive performance and the optical extraction performance of the center portion M1 and the first outer portion M2 which configure the multi-shell structured particle 190. The fullerene may be at least one selected from the group consisting of C60, C70, C72, C76, C78, C82, C84, C90, C94, and C96, but is not limited thereto.

A diameter of the multi-shell structured particle 190 may be from 0.2 μm to 1.8 μm, and specifically, from 0.3 μm to 1.5 μm. The diameter of the multi-shell structured particle 190 may be determined by the diameter of the fullerene. This is because the adhesion and the photo characteristic of the multi-shell structured particle 190 are given by the fullerene which configures the second outer portion M3 with a spherical shape and is provided on an outer wall of the first outer portion M2. Therefore, when the multi-shell structured particle 190 has the size in the above-described range, the effect of the second outer portion M3 may be maximized within a range that the hardness and the optical extraction effect of the first outer portion M2 are not degraded.

In the layer including the multi-shell structured particles 190, the center portion M1 of the multi-shell structured particle 190 is formed of the tackifier material, so that the adhesion and the adhesive holding power of the layer which includes the multi-shell structured particles 190 may be improved. When the multi-shell structured particles 190 are included not only in the adhesive layer 114, but also in the planarization layers 115 and 116 and the transparent protective layer 119, if the planarization layers 115 and 116 are formed after transferring the light emitting diode 130 onto the adhesive layer 114, the planarization layers 115 and 116 may provide additional adhesion so that the light emitting diode 130 can be stably disposed. Therefore, the product yield of the display device 100 may be improved. Further, the optical extraction efficiency of a layer including the multi-shell structured particles 190 is improved by the first outer portion M2 and the second outer portion M3, which will be described in detail with reference to FIG. 3B.

Figure 3B:
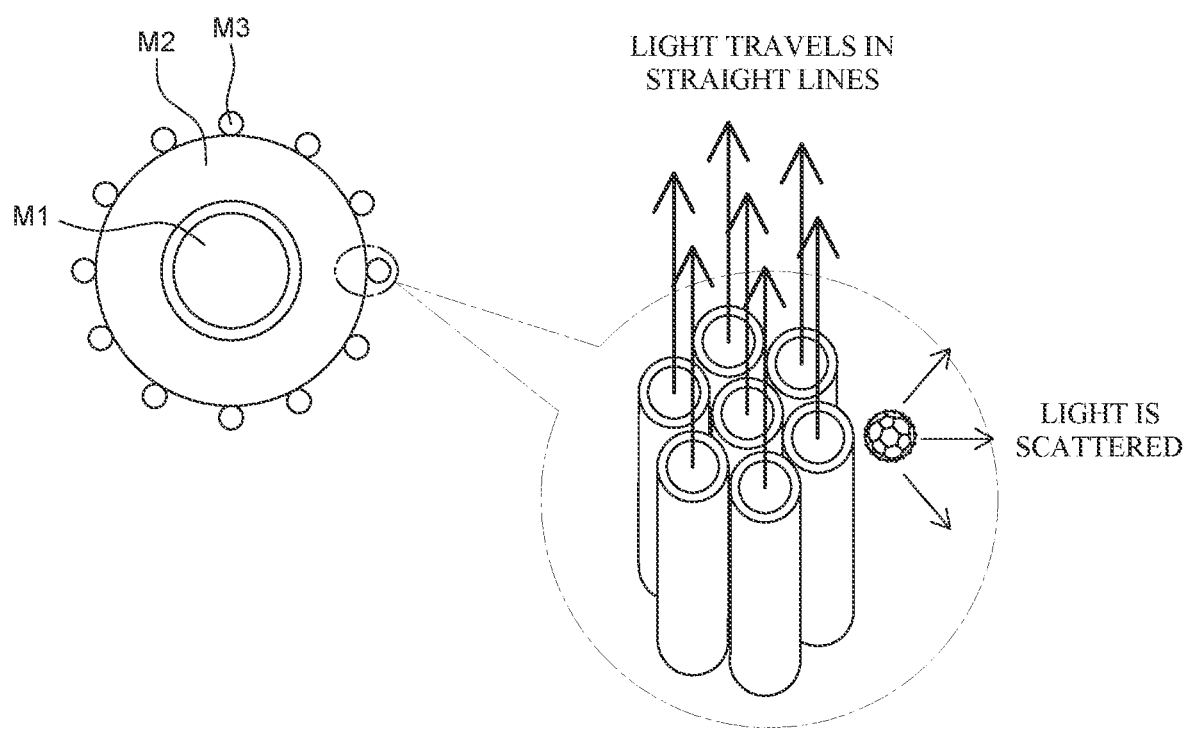
FIG. 3B is an enlarged perspective view of a first outer portion and a second outer portion of the multi-shell structured particle of FIG. 3A according to an embodiment of the present disclosure.

FIG. 3B is an enlarged perspective view of the first outer portion M2 and the second outer portion M3 of the multi-shell structured particle 190 of FIG. 3A of the present disclosure.

For example, as illustrated in FIG. 3B, the first outer portion M2 of the multi-shell structured particle 190 includes SBA-15. SBA-15 has a three-dimensionally coupled cubic structure so that three dimensional pores of SBA-15 form a hexagonal arrangement. The linearity of the light emitted from the light emitting diode 130 may be enhanced by the porous morphology of SBA-15. The enhanced linearity of the light makes it possible to manufacture the display device with the high optical extraction efficiency and the luminance of the light emitting diode 130 is improved to reduce the power consumption of the display device.

In order to maximize the effect of the first outer portion M2 which increases the optical extraction efficiency and reduces the power consumption, the first outer portion M2 may occupy from 50% to 90% of the total volume of the multi-shell structured particle 190, and specifically, from 60% to 80%.

The second outer portion M3 of the multi-shell structured particle 190 includes fullerene. The fullerene may increase the optical extraction efficiency together with the first outer portion M2. As compared with the first outer portion M2 which enhances the linearity of the light, the second outer portion M3 may enhance the scattering property of the light. Similar to the first outer portion M2, the second outer portion M3 may increase the optical extraction efficiency and reduce the power consumption.

The display device 100 according to the embodiments of the present disclosure may further include the photosensitive material and the binder not only in the adhesive composition, but also in at least one layer selected from the group consisting of the adhesive layer 114, the planarization layers 115 and 116, and the transparent protective layer 119.

According to the present disclosure, at least one layer selected from the group consisting of the adhesive layer 114, the planarization layers 115 and 116, and the transparent protective layer 119 may include the photosensitive material and the binder.

The photosensitive material imparts a photo property to at least one layer selected from the group consisting of the adhesive layer 114, the planarization layers 115 and 116, and the transparent protective layer 119 to provide a layer that can be processed by photolithography. The photosensitive material may include an oxime-based compound or a benzophenone-based compound. For example, 4,4'-bis(dimethylamino)benzophenone is used, but it is not limited thereto.

The binder may improve the adhesion. The binder may include at least one of an alkali developable binder and a silicon-based binder. For example, 1,4-butanediol dimethacrylate, triethylene glycol dimethacrylate, and siloxane-based binders are used, but it is not limited thereto.

Accordingly, in the display device 100 including the photosensitive material and the binder, the adhesion and the light transmittance are further improved. Further, when the display device 100 is manufactured, at least one layer from the group consisting of the adhesive layer 114, the planarization layers 115 and 116, and the transparent protective layer 119 may be processed by the photolithography.

Therefore, the adhesive composition according to the embodiments of the present disclosure improves the adhesive performance of the adhesive layer 114, the planarization layers 115 and 116, and the transparent protective layer 119 by the multi-shell structured particle 190 and the binder. In this way, the transfer rate of the light emitting diode 130 may be improved, which results in the reduced manufacturing cost. Further, the hardness of the layers is improved by the multi-shell structured particle 190 and the optical extraction efficiency of the light emitting diode 130 is enhanced by the first outer portion M2 and the second outer portion M3 of the multi-shell structured particle 190. Therefore, the display device 100 which exhibits a high luminance even at a low power may be provided. Further, when the photosensitive material is included in all of the adhesive layer 114, the planarization layers 115 and 116, and the transparent protective layer 119, the photo performance is improved so that these layers may be sequentially processed by photolithography during transferring process. In this case, the manufacturing process of the display device may be simplified.

The adhesive composition according to the embodiments of the present disclosure includes the photosensitive material, the binder, and the plurality of multi-shell structured particles 190. The multi-shell structured particle 190 is configured by the center portion M1 formed of a tackifier material, the first outer portion M2 including a molecular sieve which encloses the center portion M1, and the second outer portion M3 including fullerene which encloses the first outer portion. The configuration of the photosensitive material, the binder, and the multi-shell structured particle 190 is substantially the same as the configuration described above with respect to FIGS. 1 to 3B, so that a redundant description will be omitted.

The adhesive composition according to the embodiments of the present disclosure has excellent adhesion and also has an excellent light transmittance attributed from the first outer portion M2 and the second outer portion M3 of the multi-shell structured particle 190. Further, the adhesive composition according to the embodiments of the present disclosure has a photosensitivity. Accordingly, the adhesive layer 114, the planarization layers 115 and 116, and the transparent protective layer 119 of the display device 100 according to the embodiments of the present disclosure may be formed using the adhesive composition according to the embodiments of the present disclosure.

Specifically, the adhesive composition according to the embodiments of the present disclosure has excellent adhesion so that the adhesive composition may be used to form the adhesive layer 114. Further, the adhesive composition according to the embodiments of the present disclosure has a high optical extraction efficiency. Accordingly, when the planarization layers 115 and 116 and the transparent protective layer 119 are formed using the adhesive composition, a display device having a high luminance even at a low power may be provided. Further, the present disclosure satisfies all of the above-mentioned characteristics, so that all of the adhesive layer 114, the planarization layers 115 and 116, and the transparent protective layer 119 may be processed by the photolithography, thereby simplifying the manufacturing process of the display device.

Hereinafter, the effects of the present disclosure will be described in more detail with reference to Examples and Comparative Examples. However, the following Examples are set forth to illustrate the present disclosure, but the scope of the disclosure is not limited thereto.

EXAMPLES

Example 1

An adhesive composition, according to an embodiment of the present disclosure, including a plurality of multi-shell structured particles, a binder, a photosensitive material, and a solvent was prepared. A center portion of the multi-shell structured particle was formed by rosin and butyl hydroxy anisole (BHA) which is antioxidant, the first outer portion was formed by SBA-15, and the second outer portion was formed by C60 fullerene having a diameter of approximately 0.9 nm. 20 parts by weight of 1,4-butanediol diacrylate as a binder, 1 part by weight of 4,4'-bis(dimethylamino)benzophenone as a photosensitive material, and 64 parts by weight of propylene glycol monomethyl ether acetate (PGMEA) as a solvent were mixed in 5 parts by weight of the multi-shell structured particles, for about 24 hours, to prepare a liquid adhesive.

Comparative Example 1

A composition which was generally used for preparing an adhesive layer of a display device was prepared. 80 parts by weight of urethane acrylate having a polystyrene conversion weight average molecular weight ($M_w$) of 50,000 as an acrylic copolymer resin, 18 parts by weight of isobornyl acrylate as an acrylic monomer, 0.5 parts by weight of dipentaerythritol triacrylate as a crosslinking monomer, 1 part by weight of 4,4'-bis(dimethylamino)benzophenone as a photoinitiator, and 0.5 parts by weight of 3-glycidoxypropyltriethoxysilane as an additive were uniformly mixed at the room temperature for 24 hours or longer to prepare a composition.

Comparative Example 2

A composition which was generally used for a planarization layer of a display device was prepared. 20 parts by weight of a siloxane-based binder, 10 parts by weight of 1,4-butanediol diacrylate as a crosslinking monomer, 5 parts by weight of 2,4,5-trihydroxybutyrophenone as a tackifier material, 64 parts by weight of propylene glycol monomethyl ether acetate as a solvent, and 1 part by weight of 4,4'-bis(dimethylamino)benzophenone as a photoinitiator were uniformly mixed at the room temperature for 24 hours or longer to prepare a composition.

Comparative Example 3

A composition including a tackifier material, a binder, a photosensitive material, and a solvent was prepared. 20 parts by weight of a siloxane-based binder, 10 parts by weight of 1,4-butanediol diacrylate as a crosslinking monomer, 5 parts by weight of 2,4,5-trihydroxybutyrophenone as a tackifier material, 64 parts by weight of propylene glycol monomethyl ether acetate as a solvent, and 1 part by weight of 4,4'-bis(dimethylamino)benzophenone as a photoinitiator were uniformly mixed at the room temperature for 24 hours or longer to prepare a composition.

Comparative Example 4

A composition including a molecular sieve, a binder, a photosensitive material, and a solvent was prepared. 20 parts by weight of a siloxane-based binder, 10 parts by weight of 1,4-butanediol diacrylate as a crosslinking monomer, 5 parts by weight of MCM-41 as a molecular sieve, 64 parts by weight of propylene glycol monomethyl ether acetate as a solvent, and 1 part by weight of 4,4'-bis(dimethylamino) benzophenone as a photoinitiator were uniformly mixed at the room temperature for 24 hours or longer to prepare a composition.

Comparative Example 5

A composition including fullerene, a binder, a photosensitive material, and a solvent was prepared. 20 parts by weight of a siloxane-based binder, 10 parts by weight of 1,4-butanediol diacrylate as a crosslinking monomer, 3 parts by weight of a fullerene material, 66 parts by weight of propylene glycol monomethyl ether acetate as a solvent, and 1 part by weight of 4,4'-bis(dimethylamino)benzophenone as a photoinitiator were uniformly mixed at the room temperature for 24 hours or longer to prepare a composition.

Comparative Example 6

A composition including a tackifier material, a molecular sieve, a fullerene, a binder, a photosensitive material, and a solvent was prepared. 20 parts by weight of a siloxane-based binder, 10 parts by weight of 1,4-butanediol diacrylate as a crosslinking monomer, 5 parts by weight of 2,4,5-trihydroxybutyrophenone as a tackifier material, 5 parts by weight of MCM-41 as a molecular sieve, 3 parts by weight of a fullerene material, 56 parts by weight of propylene glycol monomethyl ether acetate as a solvent, and 1 part by weight of 4,4'-bis(dimethylamino)benzophenone as a photoinitiator were uniformly mixed at the room temperature for 24 hours or longer to prepare a composition.

EXPERIMENTAL EXAMPLES

Performance Comparing Evaluation

Results obtained by comparing adhesion, hardness, and photo performance of a protective layer formed using the composition prepared by Example 1 and Comparative Examples 1 to 6 are summarized in Table 1.

TABLE 1

|  | Example 1 | Comp. Ex 1 | Comp. Ex 2 | Comp. Ex 3 | Comp. Ex 4 | Comp. Ex 5 | Comp. Ex 6 |
| --- | --- | --- | --- | --- | --- | --- | --- |
| Adhesion (%) | 100 | 100 | 5 | 70 | 5 | 40 | 50 |
| Adhesion holding power (%) | 100 | 100 | 3 | 100 | 3 | 10 | 70 |
| Hardness of Protective layer | 3H | 3B | 3H | H | 3H | 3H | 3H |
| Attachment | 3 | — | 3 | 3 | 3 | 3 | — |
| Sensitivity (mJ/cm$^2$) | 100 | — | 100 | 100 | 100 | 100 | 100 |
| Resolution (μm) | 10 | — | 10 | 10 | 10 | 10 | — |
| Transmittance (%) | 95 | 85 | 90 | 95 | 95 | 95 | 90 |

In Table 1, "—" indicates a value below a measurable value.

Referring to Table 1, Comparative Example 1 is an acrylic resin composition which is used in an existing adhesive layer and it was confirmed that the hardness of the protective layer manufactured using the acrylic resin composition is lower than that of Example 1. Further, in Comparative Example 1, the sensitivity, the resolution, and the transmittance involved in the photo performance of the material used for the existing adhesive layer are lower than those of Example 1. The results show that the photo performance of the protective layer is improved by the presence of the multi-shell structured particle and the photosensitive material.

When it is considered that the existing planarization layer material of Comparative Example 2 has a comparable photo performance, as compared with Example 1; parameters of the photo performance of Comparative Example 2 are at similar levels to those of Example 1. However, the transmittance of Example 1 is approximately 5% higher than that of Comparative Example 2. It is demonstrated that the transmittance is also improved as the linearity of light and the scattering of light are improved by the porous molecular sieve and the fullerene in the multi-shell structured particle.

Further, the adhesion and the adhesion holding power of the existing planarization layer of Comparative Example 2 are very low, but the adhesion and the adhesion holding power of the planarization layer of Example 1 are very high. Thus it is understood that the liquid material including the multi-shell structured particles and the binder exhibits excellent adhesion and adhesion holding power.

When it is considered that the planarization layer not only planarizes the upper portion of the thin film transistor, but also fixes the position of the light emitting diode, if the planarization layer has excellent adhesion and adhesion holding power, the transfer rate of the light emitting diode may be improved. Therefore, when the liquid material of Example 1 is included in the planarization layer instead of the existing planarization layer material of Comparative Example 2, it can be inferred that the transfer rate and the product yield of the display device including the light emitting device may be improved.

Each of Comparative Examples 3 to 6 is a composition which includes one or more materials of layers which configure the multi-shell structured particle, except the multi-shell structured particle of Example 1 or a composition obtained by simply mixing the constituting materials of the layers. When the adhesion, the adhesion holding power, and the hardness of the protective layer formed using the liquid material manufactured in Example 1 are compared with the performance of the protective layer manufactured using the composition of each of Comparative Examples 3 to 6, the effect of the multi-shell structured particle may be confirmed by comparing with the composition including only the constituting materials of the layers except the multi-shell structured particle or the composition obtained by simply mixing all of the constituting materials of the layers.

In Comparative Example 3, the multi-shell structured particle of Example 1 was replaced with the tackifier material so that the adhesion and the strength of the protective layer are degraded as compared with Example 1. By doing this, it is understood that SBA-15 which is a porous molecular sieve and fullerene in the multi-shell structured particle are involved in improvement of the adhesion and the film hardness.

In Comparative Example 4, the multi-shell structured particle of Example 1 was replaced with the molecular sieve so that the adhesion and the adhesion holding power are significantly degraded as compared with Example 1, which is caused by the absence of the tackifier material. However, the hardness is at the equal level to that of Example 1 so that it is understood that the porous molecular sieve is directly involved in the improvement of the film hardness.

In Comparative Example 5, the multi-shell structured particle of Example 1 was replaced with the fullerene so that the adhesion and the adhesion holding power are significantly higher than those of Comparative Example 2. Therefore, it is inferred that the fullerene has an improved adhesive performance more than the porous molecular sieve. However, when compared with Example 1, the adhesion and the adhesion holding power are significantly degraded. Therefore, it is understood that when the display device is manufactured using the multi-shell structured particle, rather than using only the fullerene, the adhesive performance of the protective layer can be significantly improved.

In Comparative Example 6, as compared with Example 1, the multi-shell structured particle is not formed; rather the composition was formed by simply mixing the tackifier material, the molecular sieve, the fullerene, the binder, and the photosensitive material in the solvent so that the adhesion and the attachment are lower than those of Example 1. Further, the resolution and the transmittance are also reduced. Accordingly, the results obtained from Comparative Example 6 show that the adhesion and the photo characteristic of the multi-shell structured particle of Example 1 are significantly improved by the multi-shell configuration.

The embodiments of the present disclosure can also be described as follows:

According to an aspect of the present disclosure, a display device is provided.

In some embodiments, the display device includes a substrate including a plurality of pixels. The display device includes an adhesive layer disposed on the substrate. The display device further includes a light emitting diode disposed on the adhesive layer. The display device further includes a planarization layer disposed so as to surround the light emitting diode. The display device further includes a connection electrode disposed on the planarization layer. The display device further includes a transparent protective layer disposed on the connection electrode. At least one layer selected from the group consisting of the adhesive layer, the planarization layer, and the transparent protective layer includes a plurality of multi-shell structured particles. The multi-shell structured particle includes a center portion including a tackifier material, a first outer portion including a molecular sieve which encloses the center portion; and a second outer portion including fullerene which encloses the first outer portion.

At least one layer selected from the group consisting of the adhesive layer, the planarization layer, and the transparent protective layer further may include a binder and a photosensitive material.

The planarization layer may be a single layer covering at least a part of the light emitting diode, or a plurality of layers including a first planarization layer which planarizes an upper portion of the substrate and surrounds the light emitting diode and a second planarization layer which is disposed on the first planarization layer and covers at least a part of the light emitting diode.

A diameter of the light emitting diode may be 100 µm or smaller.

The tackifier material may include a rosin-based resin or a terpene-based resin.

The molecular sieve may have a plurality of pores and a diameter of the pore may be from 1.5 nm to 50 nm.

The molecular sieve may be at least one selected from the group consisting of SBA-1(Santa Barbara Amorphous-1), SBA-3(Santa Barbara Amorphous-3), SBA-6(Santa Barbara Amorphous-6), SBA-15(Santa Barbara Amorphous-15), MCM-41(Mobil Composition of Matter-41), and MCM-48 (Mobil Composition of Matter-48).

The first outer portion may occupy from 50% to 90% of a total volume of the multi-shell structured particle.

A diameter of the fullerene may be from 0.5 nm to 1 nm.

A diameter of the multi-shell structured particle may be from 0.2 µm to 1.8 µm.

The binder may be an alkali developable binder or a silicon-based binder and the photosensitive material may be an oxime-based compound or a benzophenone-based compound.

According to another aspect of the present disclosure, an adhesive composition is provided.

In some embodiments, the adhesive composition includes a photosensitive material, a binder, and a plurality of multi-shell structured particles. The multi-shell structured particle includes a center portion formed by a tackifier material, a first outer portion including a molecular sieve which encloses the center portion and a second outer portion including fullerene which encloses the first outer portion.

The tackifier material may include a rosin-based resin or a terpene-based resin.

The molecular sieve may have a plurality of pores and a diameter of the pore may be from 1.5 nm to 50 nm.

A diameter of the fullerene may be from 0.5 nm to 1 nm.

According to still another aspect of the present disclosure, a method for forming a display device includes: forming an adhesive layer on a substrate; attaching a light emitting diode to the adhesive layer; depositing a first planarization layer on the adhesive layer, the first planarization layer surrounding the light emitting diode; depositing a second planarization layer on the first planarization and the light emitting diode; forming a connection electrode on the second planarization layer; and depositing a transparent protective layer on the connection electrode. At least one layer of the adhesive layer, the first planarization layer, the second and the transparent protective layer includes a plurality of multi-shell structured particles. Each of the plurality of multi-shell structured particles includes: a center portion including a tackifier material; a first outer portion enclosing the center portion, the first outer portion including a molecular sieve; and a second outer portion enclosing the first outer portion, the second outer portion including fullerene.

The at least one layer of the adhesive layer, the first planarization layer, the second planarization layer, and the transparent protective layer further includes a binder and a photosensitive material.

The binder includes an alkali developable binder or a silicon-based binder, and the photosensitive material includes an oxime-based compound or a benzophenone-based compound.

Forming the connection electrode comprises patterning the second planarization layer and the first planarization layer by photolithography.

Forming the adhesive layer comprises patterning the adhesive layer by photolithography.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate including a plurality of pixels;
   an adhesive layer on the substrate;
   a light emitting diode on the adhesive layer;
   a planarization layer on the adhesive layer, the planarization layer surrounding the light emitting diode;
   a connection electrode on the planarization layer; and
   a transparent protective layer on the connection electrode,
   wherein at least one layer of the adhesive layer, the planarization layer, or the transparent protective layer includes a plurality of multi-shell structured particles,
   wherein the multi-shell structured particle includes:
   a center portion including a tackifier material;
   a first outer portion including a molecular sieve and enclosing the center portion; and
   a second outer portion including fullerene and enclosing the first outer portion.

2. The display device according to claim 1, wherein the at least one layer of the adhesive layer, the planarization layer, or the transparent protective layer further includes a binder and a photosensitive material.

3. The display device according to claim 1, wherein the planarization layer is a single layer covering at least a part of the light emitting diode, or a plurality of layers including a first planarization layer surrounding the light emitting diode and a second planarization layer on the first planarization layer, the second planarization layer covering at least a part of the light emitting diode.

4. The display device according to claim 1, wherein a diameter of the light emitting diode is 100 μm or less.

5. The display device according to claim 1, wherein the tackifier material includes a rosin-based resin or a terpene-based resin.

6. The display device according to claim 1, wherein the molecular sieve has a plurality of pores, and a diameter of the pore is from 1.5 nm to 50 nm.

7. The display device according to claim 1, wherein the molecular sieve is at least one selected from the group consisting of SBA-1(Santa Barbara Amorphous-1), SBA-3 (Santa Barbara Amorphous-3), SBA-6(Santa Barbara Amorphous-6), SBA-15(Santa Barbara Amorphous-15), MCM-41(Mobil Composition of Matter-41), and MCM-48(Mobil Composition of Matter-48).

8. The display device according to claim 1, wherein the first outer portion occupies from 50% to 90% of a total volume of the multi-shell structured particle.

9. The display device according to claim 1, wherein a diameter of the fullerene is from 0.5 nm to 1 nm.

10. The display device according to claim 1, wherein a diameter of the multi-shell structured particle is from 0.2 μm to 1.8 μm.

11. The display device according to claim 2, wherein the binder includes an alkali developable binder or a silicon-based binder, and the photosensitive material includes an oxime-based compound or a benzophenone-based compound.

12. An adhesive composition, comprising:
a photosensitive material;
a binder; and
a plurality of multi-shell structured particles,
wherein each of plurality of the multi-shell structured particles includes:
a center portion including a tackifier material;
a first outer portion including a molecular sieve and enclosing the center portion; and
a second outer portion including fullerene and enclosing the first outer portion.

13. The adhesive composition according to claim 12, wherein the tackifier material includes a rosin-based resin or a terpene-based resin.

14. The adhesive composition according to claim 12, wherein the molecular sieve has a plurality of pores, wherein a diameter of the plurality of pores is from 1.5 nm to 50 nm.

15. The adhesive composition according to claim 12, wherein a diameter of the fullerene is from 0.5 nm to 1 nm.

16. A method for forming a display device, comprising:
forming an adhesive layer on a substrate;
attaching a light emitting diode to the adhesive layer;
depositing a first planarization layer on the adhesive layer, the first planarization layer surrounding the light emitting diode;
depositing a second planarization layer on the first planarization and the light emitting diode;
forming a connection electrode on the second planarization layer; and
depositing a transparent protective layer on the connection electrode,
wherein at least one layer of the adhesive layer, the first planarization layer, the second planarization layer or the transparent protective layer includes a plurality of multi-shell structured particles, each of the plurality of multi-shell structured particles including:
a center portion including a tackifier material;
a first outer portion enclosing the center portion, the first outer portion including a molecular sieve; and
a second outer portion enclosing the first outer portion, the second outer portion including fullerene.

17. The method according to claim 16, wherein the at least one layer of the adhesive layer, the first planarization layer, the second planarization layer, or the transparent protective layer further includes a binder and a photosensitive material.

18. The method according to claim 17, wherein the binder includes an alkali developable binder or a silicon-based binder, and the photosensitive material includes an oxime-based compound or a benzophenone-based compound.

19. The method according to claim 17, wherein forming the connection electrode comprises patterning the second planarization layer and the first planarization layer by photolithography.

20. The method according to claim 18, wherein forming the adhesive layer comprises patterning the adhesive layer by photolithography.

* * * * *